United States Patent
Seo

(10) Patent No.: US 7,684,279 B2
(45) Date of Patent: Mar. 23, 2010

(54) SEMICONDUCTOR MEMORY DEVICE INCLUDING DISTRIBUTED DATA INPUT/OUTPUT LINES

(75) Inventor: Seong-young Seo, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 287 days.

(21) Appl. No.: 11/819,529

(22) Filed: Jun. 28, 2007

(65) Prior Publication Data

US 2008/0043564 A1 Feb. 21, 2008

(30) Foreign Application Priority Data

Jun. 28, 2006 (KR) ........................ 10-2006-0058878

(51) Int. Cl.
*G11C 8/00* (2006.01)
(52) U.S. Cl. ............................................ 365/230.03
(58) Field of Classification Search ............. 365/230.03
See application file for complete search history.

(56) References Cited

U.S. PATENT DOCUMENTS 5,301,142 A * 4/1994 Suzuki et al. ................. 365/51
RE38,944 E * 1/2006 Takahashi et al. ...... 365/230.03

FOREIGN PATENT DOCUMENTS

| JP | 2002-093160 | 3/2002 |
| KR | 1020000059888 A | 10/2000 |
| KR | 1020040018573 A | 3/2004 |

* cited by examiner

*Primary Examiner*—VanThu Nguyen
(74) *Attorney, Agent, or Firm*—Harness, Dickey & Pierce, P.L.C.

(57) ABSTRACT

A semiconductor memory device having a hierarchical input/output (I/O) line structure may include a plurality of core blocks, with each core block including a plurality of memory banks sharing an input/output sense amplifier. Data input/output lines may be arranged on each of the plurality of core blocks.

9 Claims, 2 Drawing Sheets

SEMICONDUCTOR MEMORY DEVICE INCLUDING DISTRIBUTED DATA INPUT/OUTPUT LINES

PRIORITY STATEMENT

This application claims priority from Korean Patent Application No. 10-2006-0058878, filed on Jun. 28, 2006 in the Korean Intellectual Property Office, the entire contents of which are incorporated herein by reference.

BACKGROUND

1. Field

Example embodiments relate to a semiconductor memory device, for example, a semiconductor device including distributed data input/output lines.

2. Description of the Related Art

A word line and a bit line may generally be arranged so as to intersect at right angles on a memory cell array of a semiconductor memory device, for example, Dynamic Random Access Memory (DRAM). The bit line may be connected to an input/output (I/O) line via which data may be input or output with a switch circuit. Also, a memory cell that may store data may be located in a region where the bit line and the word line intersect. An increase in the capacity of a semiconductor memory device may be accompanied by higher densities and a peripheral circuit to control data written to or read from the memory cell.

For higher-speed operation of I/O lines in a semiconductor memory device, the I/O lines may be arranged according to a hierarchical I/O line structure, in which they may be divided into local and global I/O lines. A hierarchical I/O line structure may reduce the loading on the I/O lines, and may increase bandwidth for a more highly-integrated semiconductor memory device. The bandwidth may refer to the amount of data that may be transmitted in a given period of time, for example, per second.

SUMMARY

Example embodiments are directed to a semiconductor memory device including distributed data input/output lines.

A semiconductor memory device may have a hierarchical input/output line structure and may include a plurality of core blocks, with each core block including a plurality of memory banks sharing an input/output sense amplifier. Data input/output lines may be arranged on each of the core blocks.

A first core block may include a first plurality of memory banks sharing a first input/output sense amplifier. A second core block may include a second plurality of memory banks sharing a second input/output sense amplifier. A third core block may include a third plurality of memory banks sharing a third input/output sense amplifier. A fourth core block among the plurality of core blocks may include a fourth plurality of memory banks sharing a fourth input/output sense amplifier. The first through fourth data input/output lines may transmit data from the first through fourth input/output sense amplifiers, respectively, and may be arranged on the corresponding first through fourth core blocks. The first through fourth data input/output lines may be formed in a third metal layer.

A first control circuit may be configured to generate a first plurality of activation signals to activate the first input/output sense amplifier, and a second plurality of activation signals to activate the second input/output sense amplifier. A second control circuit may be configured to generate a third plurality of activation signals to activate the third input/output sense amplifier, and a fourth plurality of activation signals to activate the fourth input/output sense amplifier. The first control circuit may be located in a region of a first peripheral circuit between the first and second core blocks, and the second control circuit may be located in a region of the first peripheral circuit between the third and fourth core blocks.

A first output transfer circuit may be configured to output data received from a first memory bank and a second memory bank and amplified by the first input/output sense amplifier, in response to a first plurality of control signals generated by the first control circuit. A second output transfer circuit may be configured to output data received from a third memory bank and a fourth memory bank and amplified by the second input/output sense amplifier, in response to a second plurality of control signals generated by the first control circuit. A third output transfer circuit may be configured to output data received from a fifth memory bank and a sixth memory bank and amplified by the third input/output sense amplifier, in response to a third plurality of control signals generated by the second control circuit. A fourth output transfer circuit may be configured to output data received from a seventh memory bank and an eighth memory bank and amplified by the fourth input/output sense amplifier, in response to a fourth plurality of control signals generated by the second control circuit.

A first ordering circuit may be configured to change the order of data output from the first and third output transfer circuits, and a second ordering circuit may be configured to change the order of data output from the second and fourth output transfer circuits. The first and third output transfer circuits and the first ordering circuit may be located in a second peripheral circuit region between the first and third core blocks. The second and fourth output transfer circuits and the second ordering circuit may be located in the second peripheral circuit region between the second and fourth core blocks.

The length of signal lines via which the first plurality of control signals is transmitted may be equal to the sum of the length of first data input/output lines between the first input/output sense amplifier and the first output transfer circuit, and the length of signal lines via which the first plurality of activation signals is transmitted. The length of signal lines via which the second plurality of control signals is transmitted may be equal to the sum of the length of second data input/output lines between the second input/output sense amplifier and the second output transfer circuit, and the length of signal lines via which the second plurality of activation signals is transmitted. The length of signal lines via which the third plurality of control signals is transmitted may be equal to the sum of the length of third data input/output lines between the third input/output sense amplifier and the third output transfer circuit, and the length of signal lines via which the third plurality of activation signals is transmitted. The length of signal lines via which the fourth plurality of control signals is transmitted may be equal to the sum of the length of fourth data input/output lines between the fourth input/output sense amplifier and the fourth output transfer circuit, and the length of signal lines via which the fourth plurality of activation signals is transmitted.

The signal lines via which the first through fourth control signals are transmitted may be formed in a third metal layer. The signal lines via which the first through fourth activation signals are transmitted may be formed in a third metal layer. Each of the first through fourth output transfer circuits may include tri-state buffers.

A data multiplexer may be configured to convert data transmitted from the first and second ordering circuits via the first through fourth data input/output lines into serial data. An output buffer may be configured to buffer the serial data and output the buffered serial data via a data input/output pad. The data multiplexer and the output buffer may be located in the first peripheral circuit region.

Each of the memory banks may include a plurality of memory blocks. Each memory block may include memory cells connected to bit lines and local input/output lines connected to the bit lines via switches. Global input/output lines may be connected to the local input/output lines via switches. The global input/output lines may be connected to one of the first through fourth input/output sense amplifiers.

Data transmitted to the first through fourth data input/output lines includes complimentary metal-oxide semiconductor (CMOS)-level signals.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF THE INVENTION

Figure 1:
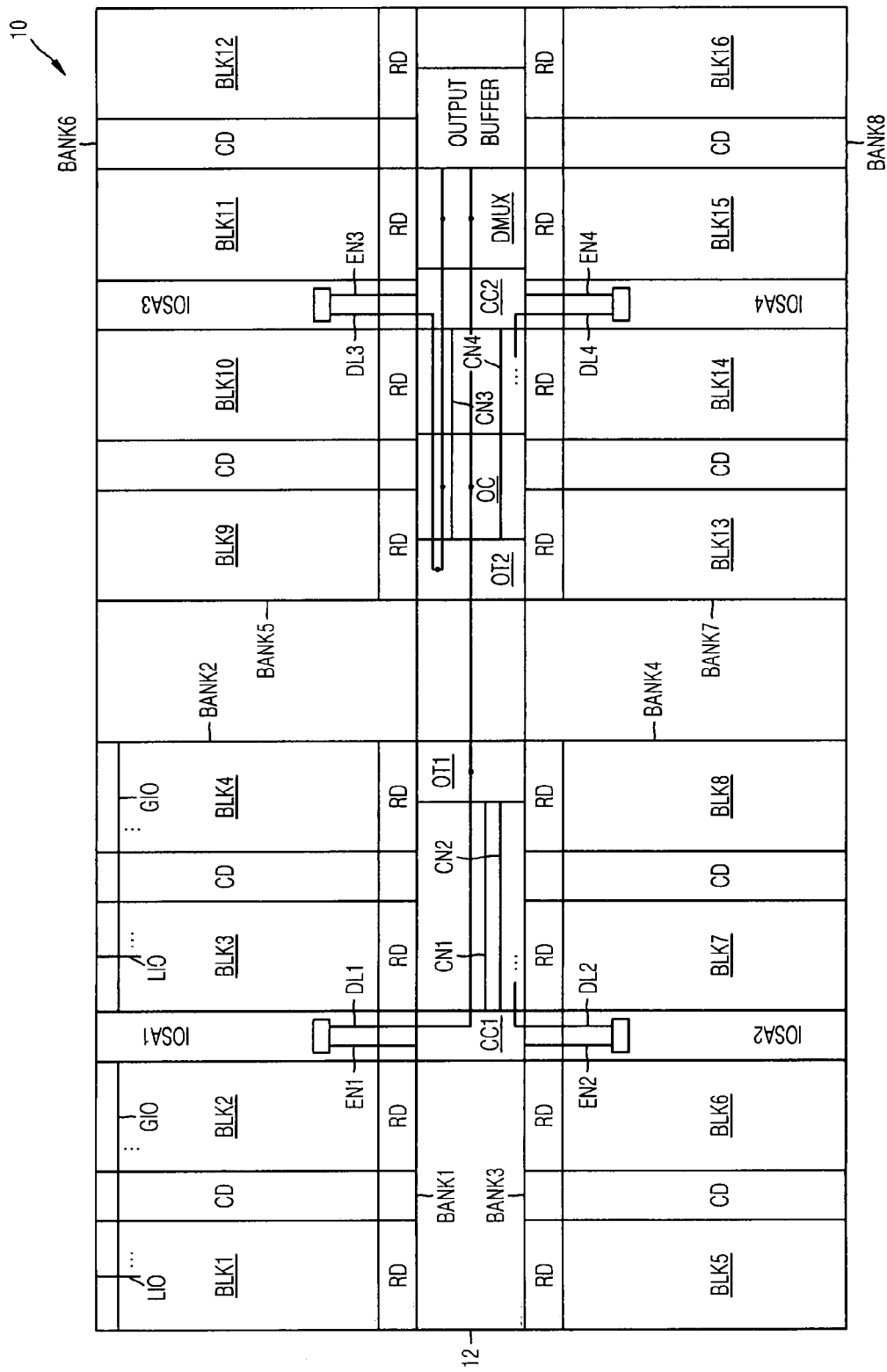
FIG. 1 is an example layout diagram of a semiconductor memory device with a hierarchical input/output (I/O) line structure illustrating a comparative example with regards to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Before describing example embodiments, a comparative example will be described with reference to FIG. 1. FIG. 1 is a layout diagram of an example semiconductor memory device 10 with a hierarchical input/output (I/O) line structure. Referring to FIG. 1, the semiconductor memory device 10 may include eight memory banks, BANK1 through BANK8. The memory banks and first through fourth I/O sense amplifiers, IOSA1 through IOSA4, may be arranged in a core region of the semiconductor memory device 10.

The first memory bank BANK1 may include a first memory block BLK1, a second memory block BLK2, row decoders RD, and a column decoder CD that may be shared by the first and second memory blocks BLK1 and BLK2. The row decoders RD and the column decoders CD may select memory cells of the first memory block BLK1 and memory cells of the second memory block BLK2 in response to a row address signal and a column address signal, respectively.

Each of the first and second memory blocks BLK1 and BLK2 may include memory cells, bit line sense amplifiers connected to the memory cells via bit lines, local I/O lines LIO connected to the bit lines via switches, and global I/O lines GIO connected to the local I/O lines LIO via switches.

The I/O lines LIO may be arranged on the first and second memory blocks BLK1 and BLK2, and may be formed by a first metal layer according to a first metal process. The global I/O lines GIO may be formed perpendicular to the local I/O lines LIO on the first metal layer, and may be formed by a second metal layer according to a second metal process.

The second through eighth memory banks BANK2 through BANK8 may include elements similar to those of the first memory bank BANK1.

The first I/O sense amplifier IOSA1 may include a plurality of unit sense amplifiers. The first I/O sense amplifier IOSA1 may amplify data received via the global I/O lines GIO of the first memory bank BANK1, and may output the amplified data to a first output transfer circuit OT1 via first data I/O lines DL1. The first I/O sense amplifier IOSA1 may also amplify data received via the global I/O lines GIO of the second memory bank BANK2, and may output the amplified data to the first output transfer circuit OT1 via the first data I/O lines DL1. The first data I/O lines DL1 may be formed by a second metal layer according to the second metal process. The second through fourth I/O sense amplifiers IOSA2 through IOSA4 may be similar to the first I/O sense amplifier IOSA1, and thus, a detailed description thereof will be omitted.

The first I/O sense amplifier IOSA1 may be shared by the first and second memory banks BANK1 and BANK2, and may be located between them. The arrangement of the second through fourth I/O sense amplifiers IOSA2 through IOSA4 may be similar to the first I/O sense amplifier IOSA1, with respect to their corresponding memory banks. The lengths of the global I/O lines GIO in the arrangement of the first through fourth I/O sense amplifiers IOSA1 through IOSA4 may be shorter than in the arrangement of an I/O sense amplifier shared by all memory banks in a center region of a semiconductor memory device. Accordingly, the bandwidth of a core block having the memory cells may be increased and/or an RAS-to-CAS Delay time (tRCD) may be reduced.

The tRCD may denote a delay between when a row address strobe signal (RAS) is activated and when a column address strobe signal (CAS) is activated. The row address strobe signal RAS may indicate that a row address signal is applied, and the column address strobe signal CAS may indicate that a column address signal is applied.

A first control circuit CC1, the first output transfer circuit OT1, the second output transfer circuit OT2, an ordering circuit OC, a second control circuit CC2, a data multiplexer DMUX, and an output buffer may be arranged in the peripheral circuit region 12 of the semiconductor memory device 10. In the peripheral circuit region 12, circuits (not shown) related to data write operations of the semiconductor memory device 10 may be arranged.

The first control circuit CC1 may generate first enable signals enabling the first I/O sense amplifier IOSA1, and second enable signals enabling the second I/O sense amplifier IOSA2. Signal lines EN1 and EN2, via which the first and second enable signals may be respectively transmitted, may be formed by a second metal layer according to the second metal process. The first control circuit CC1 may generate first control signals or second control signals for controlling the first output transfer circuit OT1.

The first output transfer circuit OT1 may transmit the data amplified by the first I/O sense amplifier IOSA1 to the ordering circuit OC via the first data I/O lines DL1 in response to the first control signals. The first output transfer circuit OT1 may transmit the data amplified by the second I/O sense amplifier IOSA2 to the ordering circuit OC via the second data I/O lines DL2 in response to the second control signals. Signal lines CN1 and CN2, via which the first and second control signals may be respectively transmitted, may be formed by a second metal layer according to the second metal process.

The ordering circuit OC may change the order of the data output from the first output transfer circuit OT1.

The data multiplexer DMUX may convert the data from the ordering circuit OC into serial data and may provide it to the output buffer. The output buffer may buffer the serial data and may output it via a data I/O pad (not shown).

Data read operations of the fifth through eighth memory banks BANK5 through BANK8 may be similar to those of the first through fourth memory banks BANK1 through BANK4. That is, the read operations of the fifth through eighth memory banks BANK5 through BANK8 may be performed via the third and fourth data I/O lines DL3 and DL4, and may be sequentially performed by the third I/O sense amplifier IOSA3 and the fourth I/O sense amplifier IOSA4, the second output transfer circuit OT2, the ordering circuit OC, the data multiplexer DMUX, and the output buffer.

The semiconductor memory device 10 may have disadvantages, however. First, the first through fourth data I/O lines DL1 through DL4, connected to outputs of the I/O sense amplifiers IOSA1 through IOSA4, may be formed according to the second metal process and located on the peripheral circuit region 12. Thus, when there is a large amount of data to be prefetched in a memory bank for a read operation, that is, when the number of data I/O lines is increased, the data I/O lines may be difficult to arrange on the peripheral circuit region 12.

Second, since the output transfer circuits OT1 and OT2 and the ordering circuit OC may be located in the peripheral circuit region 12, the area of the peripheral circuit region 12, on which signal lines may be respectively connected to the output transfer circuits OT1 and OT2 and the ordering circuit OC may be arranged, may be increased.

Third, the lengths of the data I/O lines may depend on the location of the unit sense amplifier in an I/O sense amplifier, and thus, skew may occur between data transmitted via the data I/O lines.

Fourth, the sum of the length of the data I/O lines DL1 between an I/O sense amplifier IOSA1 and an output transfer circuit OT1, for example, and the length of the signal lines EN1 via which the enable signals are transmitted, may be different from the length of the signal lines CN1 via which the control signals may be transmitted. Thus, the timing of the data output from the I/O sense amplifier IOSA1 and the timing of the control signals CN1, which may be supplied to the output transfer circuit OT1, may need to be synchronized with each other by delaying the control signals via an additional delay circuit.

Figure 2:
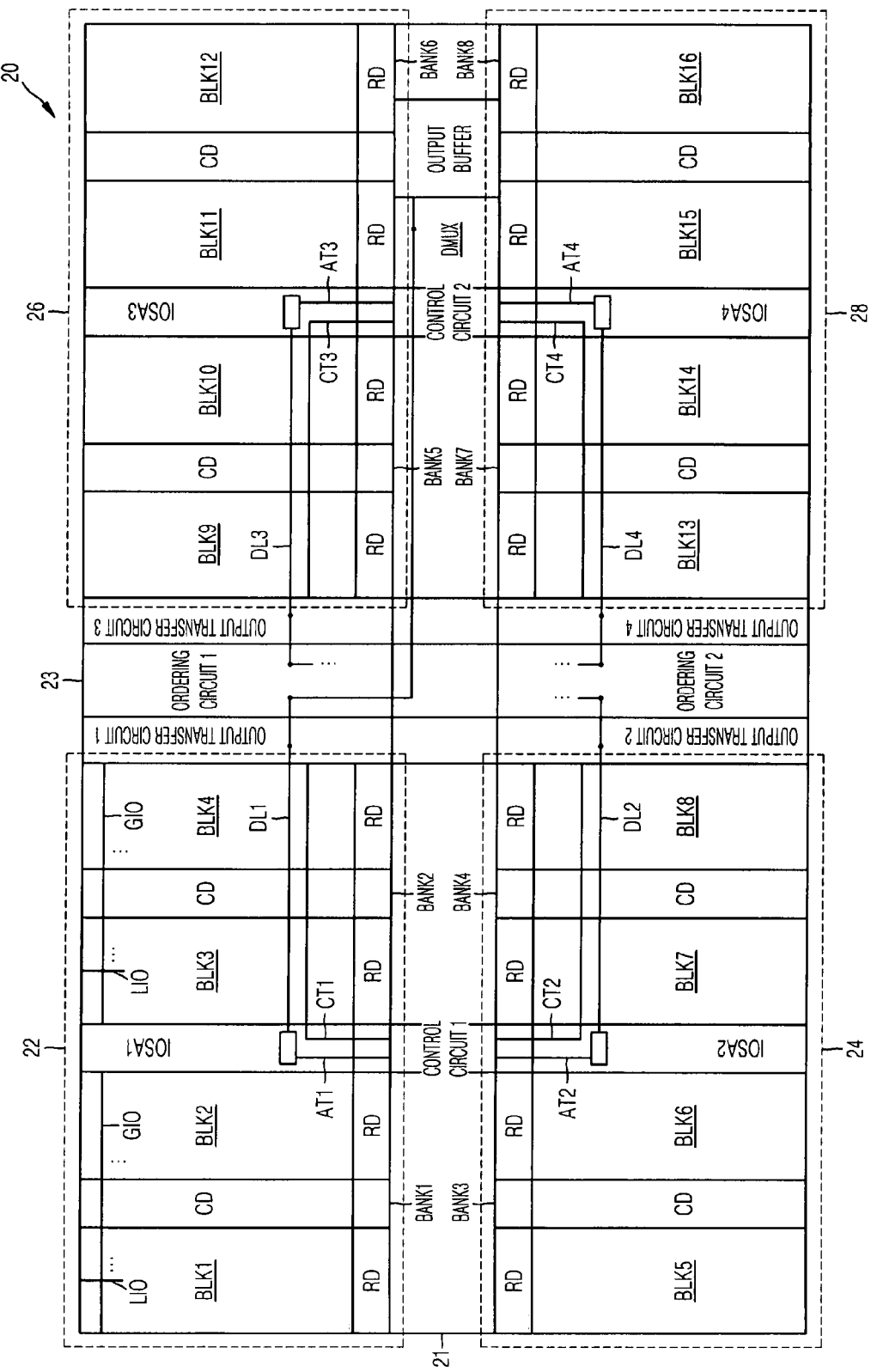
FIG. 2 is a layout diagram of a semiconductor memory device according to example embodiments.

FIG. 2 is a layout diagram of a semiconductor memory device 20 according to example embodiments. Referring to FIG. 2, the semiconductor memory device 20 may have a relatively high density, and may include a first core block 22, a second core block 24, a third core block 26, and a fourth core block 28. The first through fourth core blocks 22, 24, 26, and 28 may be located in a core region of the semiconductor memory device 20.

The first core block 22 may include a first memory bank BANK1 having a first memory block BLK1 and a second memory block BLK2, a second memory bank BANK2 having a third memory block BLK3 and a fourth memory block BLK4, and a first I/O sense amplifier IOSA1.

The first memory bank BANK1 may also include row decoders RD, as well as a column decoder CD shared by the first and second memory blocks BLK1 and BLK2. The row decoders RD and the column decoder CD may select memory cells of the first memory block BLK1 and memory cells of the second memory block BLK2 in response to a row address signal and a column address signal, respectively.

Each of the first through fourth memory blocks BLK1 through BLK4 may include memory cells, bit line sense amplifiers connected to the memory cells via bit lines, local I/O lines LIO connected to the bit lines via switches, and global I/O lines GIO connected to the local I/O lines LIO via switches. Thus, the first memory bank BANK1 may have a hierarchical I/O line structure.

The local I/O lines LIO may be arranged on the first and second memory blocks BLK1 and BLK2, and may be formed by a first metal layer according to a first metal process. The global I/O lines GIO may be arranged perpendicular to the local I/O lines LIO on the first metal layer, and may be formed by a second metal layer according to a second metal process.

The second through eighth memory banks BANK2 through BANK8 may include similar elements to those of the first memory bank BANK1, and thus, a detailed description of the elements of the second through eighth memory banks BANK2 through BANK8 will be omitted. A data read operation of each of the first through eighth memory banks BANK1 through BANK8 may be performed sequentially by one of the I/O sense amplifiers IOSA1 through IOSA4, one of first through fourth output transfer circuits, one of first and second ordering circuits, a data multiplexer, and an output buffer.

The first I/O sense amplifier IOSA1 may include a plurality of unit sense amplifiers, for example, 64 unit sense amplifiers. The first I/O sense amplifier IOSA1 may amplify data transmitted via the global I/O lines GIO of the first memory bank BANK1 and may output the amplified data to the first output transfer circuit via first data I/O lines DL1. Also, the first I/O sense amplifier IOSA1 may amplify data transmitted via the global I/O lines GIO of the second memory bank BANK2, and may output the amplified data to the first output transfer circuit via the first data I/O lines DL1.

The first data I/O lines DL1 may be arranged on the second memory bank BANK2 included in the first core block 22, and may be formed by a third metal layer according to a third metal process. Data transmitted via the first data I/O lines DL1 may be a complimentary metal-oxide semiconductor (CMOS)-level signal having levels of a power supply voltage VDD and a ground voltage VSS. The second through fourth data I/O lines DL2, DL3, and DL4 may be similar to the first data I/O line DL1, and a detailed description thereof will be omitted.

The first I/O sense amplifier IOSA1 may be shared by the first and second memory banks BANK1 and BANK2 and may be located between the first and second memory banks BANK1 and BANK2. The arrangements of the second through fourth I/O sense amplifiers IOSA2 through IOSA4 may be the same as that of the first I/O sense amplifier. The lengths of the global I/O lines GIO in the arrangements of the first through fourth I/O sense amplifiers IOSA1 through IOSA4 may be shorter than in an arrangement where an I/O sense amplifier may be shared by all the memory banks in a center region of a semiconductor memory device. Accordingly, the bandwidth of the core block may be increased and/or the tRCD may be reduced. Thus, the semiconductor memory device 20 may be capable of performing higher-bandwidth operations.

The second through fourth core blocks 24, 26, and 28 may include similar elements to those of the first core block 22, and a detailed description thereof will be omitted.

As described above, the first through fourth data I/O lines DL1, DL2, DL3, and DL4, via which the data from the first I/O sense amplifier IOSA1, the data from the second I/O sense amplifier IOSA2, the data from the third I/O sense amplifier IOSA3, and the data from the fourth I/O sense amplifier IOSA4 may be respectively transmitted, may be distributed on the first through fourth core blocks 22, 24, 26, and 28. Accordingly, if a large amount of data is prefetched in a memory bank for a read operation, it may be possible to more easily arrange the data I/O lines. For example, the semiconductor memory device 20 may be capable of improving the efficiency of the data I/O line layout.

First and second control circuits, the first through fourth output transfer circuits, the first and second ordering circuits, the data multiplexer DMUX, and the output buffer may be located in peripheral circuit regions of the semiconductor memory device 20. For example, the first and second control circuits, the data multiplexer DMUX, and the output buffer may be located in a first peripheral circuit region 21. Alternatively, circuits (not shown) related to a data write operation of the semiconductor memory device 20 may be arranged in the first peripheral circuit region 21. The first through fourth output transfer circuits and the first and second ordering circuits may be arranged in a second peripheral circuit region 23.

The first control circuit may generate first activation signals to activate the first I/O sense amplifier IOSA1, and second activation signals to activate the second I/O sense amplifier IOSA2. The first control circuit may be located in the first peripheral circuit region 21, which may be a region between the first core block 22 and the second core block 24. Signal lines AT1 and AT2, via which the first and second activation signals may be respectively transmitted, may be formed by a third metal layer according to the third metal process.

Also, the first control circuit may generate first control signals to control the first output transfer circuit, and second control signals to control the second output transfer circuit. Signal lines CT1 and CT2, via which the first and second control signals may be respectively transmitted, may be formed by a third metal layer according to the third metal process. The second control circuit may be similar to the first control circuit, and a detailed description thereof will be omitted.

As illustrated in FIG. 2, the length of the signal lines CT1, via which the first control signals may be transmitted, may be substantially equal to the sum of the length of the first data I/O lines DL1, which may be between the first I/O sense amplifier IOSA1 and the first output transfer circuit, and the length of the signal lines AT1, via which the first activation signals may be transmitted. The characteristics of the lengths of the second through fourth control signal lines CT2, CT3, and CT4 may be similar to the above-described characteristics of the first control signal lines CT1.

Accordingly, the timing of the data from the I/O sense amplifier IOSA1 and the timing of the control signals CT1, which may be input to the output transfer circuit, for example, the first output transfer circuit, may be synchronized with each other.

The first output transfer circuit may transmit the data output from the first memory bank BANK1, which may be amplified by the first I/O sense amplifier IOSA1, to the first ordering circuit via the first data I/O lines DL1, and in response to the first control signals. Also, the first output transfer circuit may transmit the data from the second memory bank BANK2, which may be amplified by the first I/O sense amplifier IOSA1, to the first ordering circuit via the first data I/O lines DL1, and in response to the first control signals. The first output transfer circuit may be implemented as tri-state buffers, for example. The elements and operation of the third output transfer circuit may be similar to those of the first output transfer circuit described above.

The second output transfer circuit may transmit the data from the third memory bank BANK3, which may be amplified by the second I/O sense amplifier IOSA2, to the second ordering circuit via the second data I/O lines DL2, and in response to the second control signals. Also, the second output transfer circuit may transmit the data from the fourth memory bank BANK4, which may be amplified by the second I/O sense amplifier IOSA2, to the second ordering circuit via the second data I/O lines DL2 in response to the second control signals. The second output transfer circuit may be implemented as tri-state buffers, for example. The elements and operation of the fourth output transfer circuit may be similar to those of the second output transfer circuit described above.

The first ordering circuit may change the order of data transmitted from the first and third output transfer circuits. For example, the first ordering circuit may be a sequential type ordering circuit or an interleave type ordering circuit that may change the order of data.

The second ordering circuit may change the order of data transmitted from the second and fourth output transfer circuits. For example, the second ordering circuit may be a sequential type ordering circuit or an interleave type ordering circuit that may change the order of data.

As illustrated in FIG. 2, the first and third output transfer circuits and the first ordering circuit may be distributed in the second peripheral circuit region 23, which may be a region between the first core block 22 and the third core block 26. The second and fourth output transfer circuits and the second ordering circuit may be distributed in the second peripheral circuit region 23, which may be a region between the second core block 24 and the fourth core block 28, and thereby may reduce the area of the first peripheral circuit region 21, in which circuits related to a write operation may be located. Also, the distributed arrangement of the output transfer circuit and the ordering circuit may prevent the lengths of data I/O lines from varying depending on the location of a unit sense amplifier of an I/O sense amplifier. Accordingly, it may be possible to reduce skew occurring between data transmitted via the data I/O lines.

The data multiplexer DMUX may convert data, which may be transmitted from the first and second ordering circuits to the first through fourth data I/O lines DL1 through DL4, into serial data and may output the serial data to the output buffer. The output buffer may buffer the serial data and may output the buffered serial data via a data I/O pad (not shown).

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A semiconductor memory device having a hierarchical input/output line structure, comprising:
    a first core block among a plurality of core blocks including a first plurality of memory banks sharing a first input/output sense amplifier;
    a second core block among the plurality of core blocks including a second plurality of memory banks sharing a second input/output sense amplifier;
    a third core block among the plurality of core blocks including a third plurality of memory banks sharing a third input/output sense amplifier;
    a fourth core block among the plurality of core blocks including a fourth plurality of memory banks sharing a fourth input/output sense amplifier;
    first through fourth data input/output lines transmitting data from the first through fourth input/output sense amplifiers, respectively, where the first through fourth data input/output lines are arranged on the corresponding first through fourth core blocks;
    a first control circuit configured to generate a first plurality of activation signals to activate the first input/output sense amplifier, and a second plurality of activation signals to activate the second input/output sense amplifier, where the first control circuit is located in a region of a first peripheral circuit between the first and second core blocks;
    a second control circuit configured to generate a third plurality of activation signals to activate the third input/output sense amplifier, and a fourth plurality of activation signals to activate the fourth input/output sense amplifier, where the second control circuit is located in a region of the first peripheral circuit between the third and fourth core blocks;
    a first output transfer circuit configured to output data received from a first memory bank and a second memory bank and amplified by the first input/output sense amplifier, in response to a first plurality of control signals generated by the first control circuit;
    a second output transfer circuit configured to output data received from a third memory bank and a fourth memory bank and amplified by the second input/output sense amplifier, in response to a second plurality of control signals generated by the first control circuit;
    a third output transfer circuit configured to output data received from a fifth memory bank and a sixth memory bank and amplified by the third input/output sense amplifier, in response to a third plurality of control signals generated by the second control circuit;
    a fourth output transfer circuit configured to output data received from a seventh memory bank and an eighth memory bank and amplified by the fourth input/output sense amplifier, in response to a fourth plurality of control signals generated by the second control circuit;
    a first ordering circuit configured to change the order of data output from the first and third output transfer circuits; and
    a second ordering circuit configured to change the order of data output from the second and fourth output transfer circuits, wherein
    the first and third output transfer circuits and the first ordering circuit are located in a second peripheral circuit region between the first and third core blocks, and
    the second and fourth output transfer circuits and the second ordering circuit are located in the second peripheral circuit region between the second and fourth core blocks.

2. The semiconductor memory device of claim 1, wherein the first through fourth data input/output lines are formed in a third metal layer.

3. The semiconductor memory device of claim 1, wherein the length of signal lines via which the first plurality of control signals is transmitted is equal to the sum of the length of first data input/output lines between the first input/output sense amplifier and the first output transfer circuit, and the length of signal lines via which the first plurality of activation signals is transmitted,
    the length of signal lines via which the second plurality of control signals is transmitted is equal to the sum of the length of second data input/output lines between the second input/output sense amplifier and the second output transfer circuit, and the length of signal lines via which the second plurality of activation signals is transmitted,
    the length of signal lines via which the third plurality of control signals is transmitted is equal to the sum of the length of third data input/output lines between the third input/output sense amplifier and the third output transfer circuit, and the length of signal lines via which the third plurality of activation signals is transmitted, and
    the length of signal lines via which the fourth plurality of control signals is transmitted is equal to the sum of the length of fourth data input/output lines between the fourth input/output sense amplifier and the fourth output transfer circuit, and the length of signal lines via which the fourth plurality of activation signals is transmitted.

4. The semiconductor memory device of claim 3, wherein the signal lines via which the first through fourth control signals are transmitted are formed in a third metal layer.

5. The semiconductor memory device of claim 3, wherein the signal lines via which the first through fourth activation signals are transmitted are formed in a third metal layer.

6. The semiconductor memory device of claim 1, wherein each of the first through fourth output transfer circuits includes tri-state buffers.

7. The semiconductor memory device of claim 1, further comprising:
- a data multiplexer configured to convert data transmitted from the first and second ordering circuits via the first through fourth data input/output lines into serial data; and
- an output buffer configured to buffer the serial data and output the buffered serial data via a data input/output pad,
- wherein the data multiplexer and the output buffer are located in the first peripheral circuit region.

8. The semiconductor memory device of claim 1, wherein each of the memory banks comprises:
- a plurality of memory blocks, each including memory cells connected to bit lines and local input/output lines connected to the bit lines via switches; and
- global input/output lines connected to the local input/output lines via switches,
- wherein the global input/output lines are connected to one of the first through fourth input/output sense amplifiers.

9. The semiconductor memory device of claim 1, wherein data transmitted to the first through fourth data input/output lines includes complimentary metal-oxide semiconductor (CMOS)-level signals.

* * * * *